United States Patent
Lee

(10) Patent No.: US 10,419,002 B1
(45) Date of Patent: Sep. 17, 2019

(54) APPARATUS AND METHOD OF RECTIFYING RESOLVER OUTPUT SIGNAL

(71) Applicants: Hyundai Motor Company, Seoul (KR); Kia Motors Corporation, Seoul (KR)

(72) Inventor: Myoungseok Lee, Gyeonggi-do (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 0 days.

(21) Appl. No.: 16/191,729

(22) Filed: Nov. 15, 2018

(30) Foreign Application Priority Data

Jul. 27, 2018 (KR) .......................... 10-2018-0088029

(51) Int. Cl.
| | |
|---|---|
| H03M 1/48 | (2006.01) |
| H03K 19/21 | (2006.01) |
| H03K 19/177 | (2006.01) |
| H03K 19/003 | (2006.01) |
| G01D 5/244 | (2006.01) |
| H02P 5/00 | (2016.01) |

(52) U.S. Cl.
CPC ....... *H03K 19/21* (2013.01); *H03K 19/00323* (2013.01); *H03K 19/17716* (2013.01); *B65H 2403/923* (2013.01); *G01D 5/24428* (2013.01); *G05B 2219/41326* (2013.01); *H02P 5/00* (2013.01); *H02P 2209/00* (2013.01)

(58) Field of Classification Search
CPC ...... G01D 5/24428; G05B 2219/41326; H02P 5/00; H02P 2209/00; B65H 2403/923
USPC .............. 341/115; 318/685, 721, 700, 400.2
See application file for complete search history.

(56) References Cited

U.S. PATENT DOCUMENTS 6,084,376 A * 7/2000 Piedl .................... G01D 5/2073
318/254.2

FOREIGN PATENT DOCUMENTS

| KR | 101012741 B1 | 2/2011 |
|---|---|---|
| KR | 101294566 B1 | 8/2013 |
| KR | 101361551 B1 | 2/2014 |

* cited by examiner

*Primary Examiner* — Joseph J Lauture
(74) *Attorney, Agent, or Firm* — Mintz Levin Cohn Ferris Glovsky and Popeo, P.C.; Peter F. Corless

(57) ABSTRACT

An apparatus for rectifying a resolver output signal may include: a resolver configured to receive an excitation signal and to output a resolver output signal based on the excitation signal, the excitation signal indicating a position of a rotor of a motor; a microprocessor configured to receive a reference rectification signal generated by rectification of the excitation signal and to output a delay signal by delaying the reference rectification signal according to a preset value; and a delay amount detection circuit configured to receive a reference excitation signal generated by rectification of the resolver output signal, to receive the delay signal from the microprocessor, to compare the reference excitation signal with the delay signal, and to output a phase difference detection signal and a delay amount excess/shortage signal to the microprocessor.

14 Claims, 17 Drawing Sheets

FIG. 8A
FIG. 8B
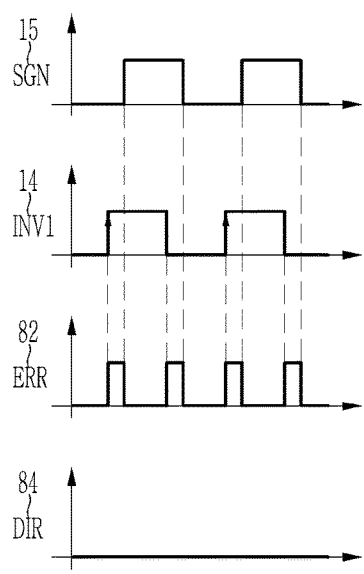
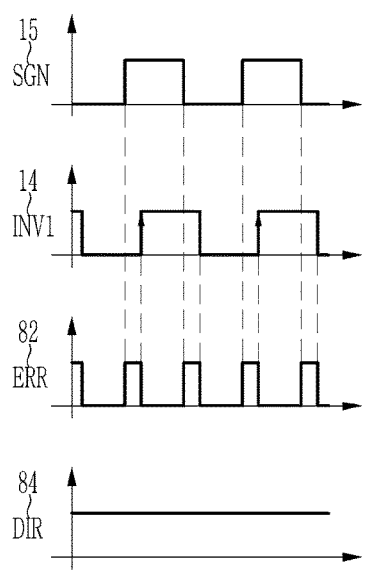

APPARATUS AND METHOD OF RECTIFYING RESOLVER OUTPUT SIGNAL

CROSS-REFERENCE TO RELATED APPLICATION

This application claims the benefit of priority to Korean Patent Application No. 10-2018-0088029, filed in the Korean Intellectual Property Office on Jul. 27, 2018, the entire contents of which are incorporated herein by reference.

BACKGROUND OF THE DISCLOSURE

(a) Technical Field of the Disclosure

The present disclosure relates to an apparatus and a method of rectifying a resolver output signal, and more particularly, to an apparatus and a method of rectifying a resolver output signal capable of calculating a delay amount of the resolver output signal using a microprocessor and rectifying the resolver output signal.

(b) Description of the Related Art

In order to drive a permanent magnet synchronous motor, accurate position information of a rotor is required. When a resolver is used, an absolute position of the rotor may be recognized. However, if the resolver experiences a difference in a transformation ratio, an unbalanced excitation signal, a non-uniform inductance component, distortion in a signal processing circuit, or the like, it can cause unbalance in signal magnitude. This can result in a periodical error component appearing in the position information, thus deteriorating motor control performance.

In order to solve such an error, conventional techniques involve use of a resolver digital converter (RDC). In the case of using an RDC, a phase lead capacitor or a phase lag capacitor is used, but it is impossible to perform compensation depending on a state change of the resolver. Several other solutions for compensating for a delay amount by the resolver, such as filters, have been suggested. However, they are mathematically complicated, requiring a large load in a microprocessor, and difficult to implement.

The above information disclosed in this Background section is only for enhancement of understanding of the background of the disclosure, and therefore it may contain information that does not form the related art.

SUMMARY OF THE DISCLOSURE

The present disclosure has been made in an effort to provide an apparatus and a method of rectifying a resolver output signal having advantages of decreasing an error of the resolver output signal by using a microprocessor to rectify the resolver output signal in real-time without using a resolver digital converter (RDC), decreasing the size of a rectification circuit, improving output linearity, and simplifying a compensation circuit using an element such as an operational amplifier.

According to embodiments of the present disclosure, an apparatus for rectifying a resolver output signal may include: a resolver configured to receive an excitation signal and to output a resolver output signal based on the excitation signal, the excitation signal indicating a position of a rotor of a motor; a microprocessor configured to receive a reference rectification signal generated by rectification of the excitation signal and to output a delay signal by delaying the reference rectification signal according to a preset value; and a delay amount detection circuit configured to receive a reference excitation signal generated by rectification of the resolver output signal, to receive the delay signal from the microprocessor, to compare the reference excitation signal with the delay signal, and to output a phase difference detection signal and a delay amount excess/shortage signal to the microprocessor. The microprocessor may include a switching amplification circuit configured to detect a delay amount of the resolver output signal based on the phase difference detection signal, to output a rectification signal based on the delay amount, to receive the rectification signal, to rectify the resolver output signal by performing a switching operation based on the rectification signal, and to output a compensation signal.

The delay amount detection circuit may include: an exclusive-OR gate configured to receive the delay signal and the reference excitation signal and to output the phase difference detection signal which indicates a phase difference between the delay signal and the reference excitation signal; and a D-type flip-flop configured to receive the reference excitation signal as an input signal, to receive the delay signal as a reference clock, and to output the delay amount excess/shortage signal indicating whether the delay signal leads or lags with respect to the reference excitation signal.

The microprocessor may detect the delay amount using a output compare function.

The microprocessor may detect the delay amount using an input capture function.

The microprocessor may include: a counter circuit configured to initialize a count when the reference rectification signal is input, such that an interrupt is generated, by increasing the count from an initial value; a comparison value register configured to store the delay amount; a comparison circuit configured to detect whether the delay amount is equal to the count; and an output circuit configured to output a preset output scheduled value when it is detected that the delay amount is equal to the count.

When a polarity of the rectification signal is equal to a polarity of the resolver output signal, the switching amplification circuit may operate as a buffer circuit when the resolver output signal has a positive polarity and operate as an inverting amplifier when the resolver output signal has a negative polarity.

When a polarity of the rectification signal is opposite of a polarity of the resolver output signal, the switching amplification circuit may operate as an inverting amplifier when the resolver output signal has a positive polarity and operates as a buffer circuit when the resolver output signal has a negative polarity.

Furthermore, according to embodiments of the present disclosure, a method for rectifying a resolver output signal output by a resolver may include: outputting, by a microprocessor, a delay signal by delaying an excitation signal output by an excitation signal generator by a preset value; comparing, by a delay amount detection circuit, the delay signal with a reference excitation signal generated by rectification of the excitation signal; outputting, by the delay amount detection circuit, a phase difference detection signal and a delay amount excess/shortage signal to the microprocessor; detecting, by the microprocessor, a delay amount of the resolver output signal based on the phase difference detection signal; outputting, by the microprocessor, a rectification signal generated by delaying a reference rectification signal by the delay amount; receiving, by a switching amplification circuit, the rectification signal; and outputting, by the switching amplification circuit, a compensation signal generated by rectification of the resolver output signal by a switching operation based on the rectification signal.

The delay amount detection circuit may include an exclusive-OR gate and a D-type flip-flop.

The outputting of the phase difference detection signal and the delay amount excess/shortage signal may include receiving, by the exclusive-OR gate, the delay signal and the reference excitation signal; outputting, by the exclusive-OR gate, the phase difference detection signal which indicates a phase difference between the delay signal and the reference excitation signal; receiving, by the D-type flip-flop, the reference excitation signal as an input signal; receiving, by the D-type flip-flop, the delay signal as a reference clock; and outputting, by the D-type flip-flop, the delay amount excess/shortage signal indicating whether the delay signal leads or lags with respect to the reference excitation signal.

The method may further include detecting, by the microprocessor, the delay amount using an output compare function.

The method may further include detecting, by the microprocessor, the delay amount using an input capture function.

The method may further include: initializing, by the microprocessor, a count when the reference rectification signal is input, such that an interrupt is generated, by increasing the count from an initial value; storing, by the microprocessor, the delay amount in a comparison value register; detecting, by the microprocessor, whether the delay amount is equal to the count; and outputting, by the microprocessor, output a preset output scheduled value when it is detected that the delay amount is equal to the count.

When a polarity of the rectification signal is equal to a polarity of the resolver output signal, the switching amplification circuit may operate as a buffer circuit when the resolver output signal has a positive polarity and operates as an inverting amplifier when the resolver output signal has a negative polarity.

When a polarity of the rectification signal is opposite of a polarity of the resolver output signal, the switching amplification circuit may operate as an inverting amplifier when the resolver output signal has a positive polarity and operates as a buffer circuit when the resolver output signal has a negative polarity.

As set forth above, in accordance with embodiments of the present disclosure, a circuit may be configured using an element securing linearity, such as an operational amplifier (op-amp), to improve linearity. A circuit may be implemented by a small number of components including the op-amp and a switching amplification circuit, unlike a conventional a resolver digital converter (RDC) in which a plurality of components are used. Thus such the size of the circuit may be decreased, and a resolver output signal is compensated in real-time, such that a measurement error may be decreased.

BRIEF DESCRIPTION OF THE DRAWINGS

In order to better understand the present disclosure, various forms will be described by way of example, and reference numerals will be given to the accompanying drawings.

FIGS. 8A and 8B illustrate a phase difference detection signal and a delay amount excess/shortage signal according to embodiments of the present disclosure.

Figure 1:
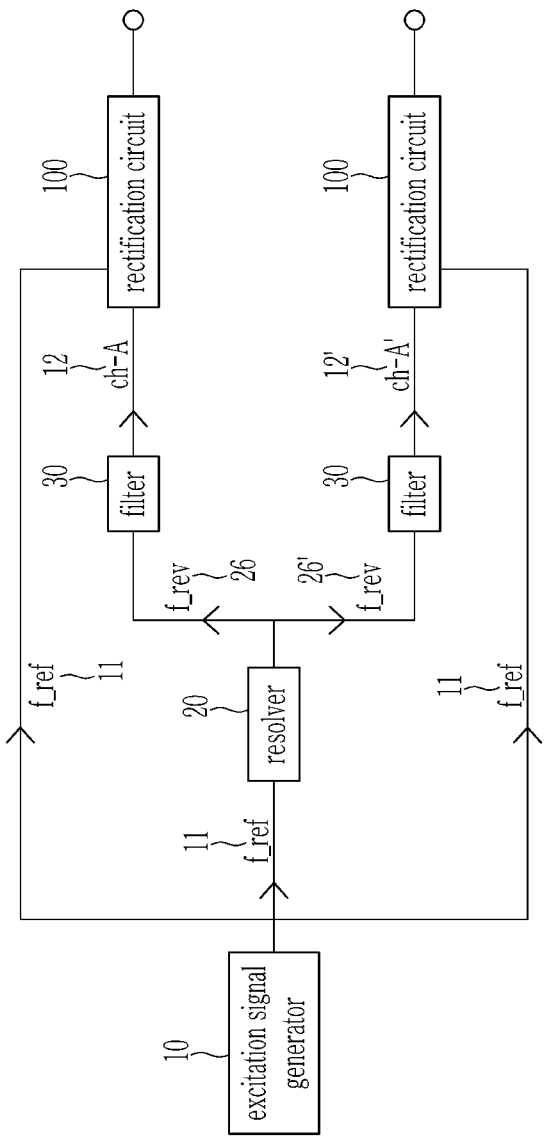
FIG. 1 is a block diagram illustrating a system of rectifying a resolver output signal according to embodiments of the present disclosure.

| Description of symbols | |
|---|---|
| 10: excitation signal generator | 11: excitation signal |
| 12: resolver output signal | 13: reference rectification signal |
| 14: delay signal | 15: reference excitation signal |
| 16: rectification signal | 17: compensation signal |
| 20: resolver | 21: primary side winding |
| 22: L1 winding | 23: L2 winding |
| 24: rotor | 25: excitation input signal |
| 26: resolver signal | 30: filter |
| 40: amplifier | 50: first comparator |
| 60: second comparator | 70: switching amplification circuit |
| 71: counter circuit | 72: comparison circuit |
| 73: comparison value register | 74: output circuit |
| 80: delay amount detection | 81: exclusive-OR gate |

-continued

| | Description of symbols | | |
|---|---|---|---|
| | circuit | | |
| 82: | phase difference detection signal | 83: | D-type flip-flop |
| 84: | delay amount excess/ shortage signal | 90: | microprocessor |
| 91, 92, 93: | resistor | 94: | switch |
| 100: | rectification circuit | 141: | input capture register |
| 142: | counter circuit | 143: | comparison circuit |
| 144: | comparison value register | 145: | output circuit |

DETAILED DESCRIPTION OF THE EMBODIMENTS

In the following detailed description, only certain exemplary embodiments of the present disclosure have been shown and described, simply by way of illustration. As those skilled in the art would realize, the described embodiments may be modified in various different ways, all without departing from the spirit or scope of the present disclosure. Accordingly, the drawings and description are to be regarded as illustrative in nature and not restrictive. Like reference numerals designate like elements throughout the specification.

The terminology used herein is for the purpose of describing particular embodiments only and is not intended to be limiting of the disclosure. Throughout the present specification, unless explicitly described to the contrary, the word "comprise" and variations such as "comprises" or "comprising", will be understood to imply the inclusion of stated elements but not the exclusion of any other elements. The singular forms "a," "an," and "the" are intended to include the plural forms as well, unless the context clearly indicates otherwise. As used herein, the term "and/or" includes any and all combinations of one or more of the associated listed items.

Additionally, it is understood that one or more of the below methods, or aspects thereof, may be executed by at least one control unit. The term "control unit" may refer to a hardware device that includes a memory and a processor (or microprocessor). The memory is configured to store program instructions, and the processor is specifically programmed to execute the program instructions to perform one or more processes which are described further below. The control unit may control operation of units, modules, parts, devices, or the like, as described herein. Moreover, it is understood that the below methods may be executed by an apparatus comprising the control unit in conjunction with one or more other components, as would be appreciated by a person of ordinary skill in the art.

Furthermore, the control unit of the present disclosure may be embodied as non-transitory computer readable media containing executable program instructions executed by a processor. Examples of the computer readable mediums include, but are not limited to, ROM, RAM, compact disc (CD)-ROMs, magnetic tapes, floppy disks, flash drives, smart cards and optical data storage devices. The computer readable recording medium can also be distributed throughout a computer network so that the program instructions are stored and executed in a distributed fashion, e.g., by a telematics server or a Controller Area Network (CAN).

FIG. 1 is a block diagram illustrating a system of rectifying a resolver output signal according to embodiments of the present disclosure.

As illustrated in FIG. 1, a system of detecting a delay amount of a resolver output signal according to embodiments of the present disclosure is used to detect and compensate for a delay amount of a signal output from a resolver 20. The resolver 20 is used to detect a position of a rotor of a motor, but resolver signals 26 and 26' are delayed by filters 30, and the like, such that an accurate position of the rotor is not measured.

The system of detecting a delay amount of a resolver output signal includes an excitation signal generator 10, the resolver 20, the filters 30, and rectification circuits 100.

The excitation signal generator 10 outputs an excitation signal 11, which is a signal for a position of the motor to input the excitation signal 11 to each of the resolver 20 and the rectification circuits 100. For example, the excitation signal generator 10 may be a central processing unit (CPU), a motor, or the like, but is not limited thereto. In addition, an excitation input signal 25 generated by amplifying the excitation signal 11 by an amplifier 40 may be input to the resolver 20 (see FIGS. 2 and 3). A process of generating the excitation signal 11 by the excitation signal generator 10 is apparent to a person of an ordinary skill in the art, and a description therefor is thus omitted herein.

The resolver 20, which is a device for detecting an angle of the rotor of the motor, receives the excitation signal 11 and outputs the resolver signals 26 and 26'. The resolver 20 may receive the excitation input signal 25 generated by amplifying the excitation signal 11 by the amplifier 40.

The filters 30, which are devices for removing noise of the resolver signals 26 and 26', receive the resolver signals 26 and 26' from the resolver 20, remove the noise of the resolver signals 26 and 26', and output resolver output signals 12 and 12'.

A structure of the resolver 20 and the resolver signals 26 and 26' will be described with reference to FIG. 2.

Figure 2:
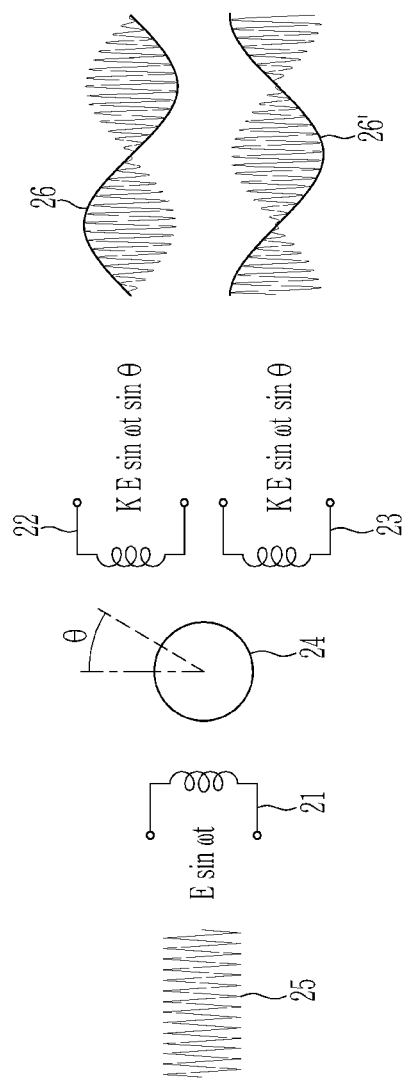
FIG. 2 is views illustrating a structure of a resolver and waveforms of resolver signals according to embodiments of the present disclosure.

FIG. 2 is views illustrating a structure of a resolver and waveforms of resolver signals according to embodiments of the present disclosure.

The resolver 20 includes a primary side winding 21, a secondary side L1 winding 22, a secondary side L2 winding 23, and a rotor 24.

The excitation input signal 25 is input to the primary side winding 21. In the secondary side L1 winding 22, a sine wave by a magnetic flux interlinkage and the excitation input signal 25 are multiplied by each other, such that the resolver signal 26 is output. The excitation signal 11 may be input to the primary side winding 21.

In the secondary side L2 winding 23, a cosine wave by a magnetic flux interlinkage and the excitation input signal 25 are multiplied by each other, such that the resolver signal 26' is output.

The resolver signals 26 and 26' are signals having a sine wave and a cosine wave, respectively, and periodically output.

A process of outputting the resolver signals 26 and 26' is apparent to a person of an ordinary skill in the art, and a description therefor is thus omitted. The noise of the resolver signals 26 and 26' is removed while the resolver signals 26 and 26' pass through the filters 30, respectively, the resolver signals 26 and 26' of which the noise is removed are output as the resolver output signals 12 and 12', and the resolver output signals 12 and 12' are input to the respective rectification circuits 100 in parallel. Since an operation of a system of the rectification circuit 100 is the same as that described above, a case in which one resolver output signal 12 is rectified by the rectification circuit 100 will be described.

The rectification circuit 100 receives and rectifies the resolver output signal 12. The rectification circuit 100 will be described in detail with reference to FIG. 3.

Figure 3:
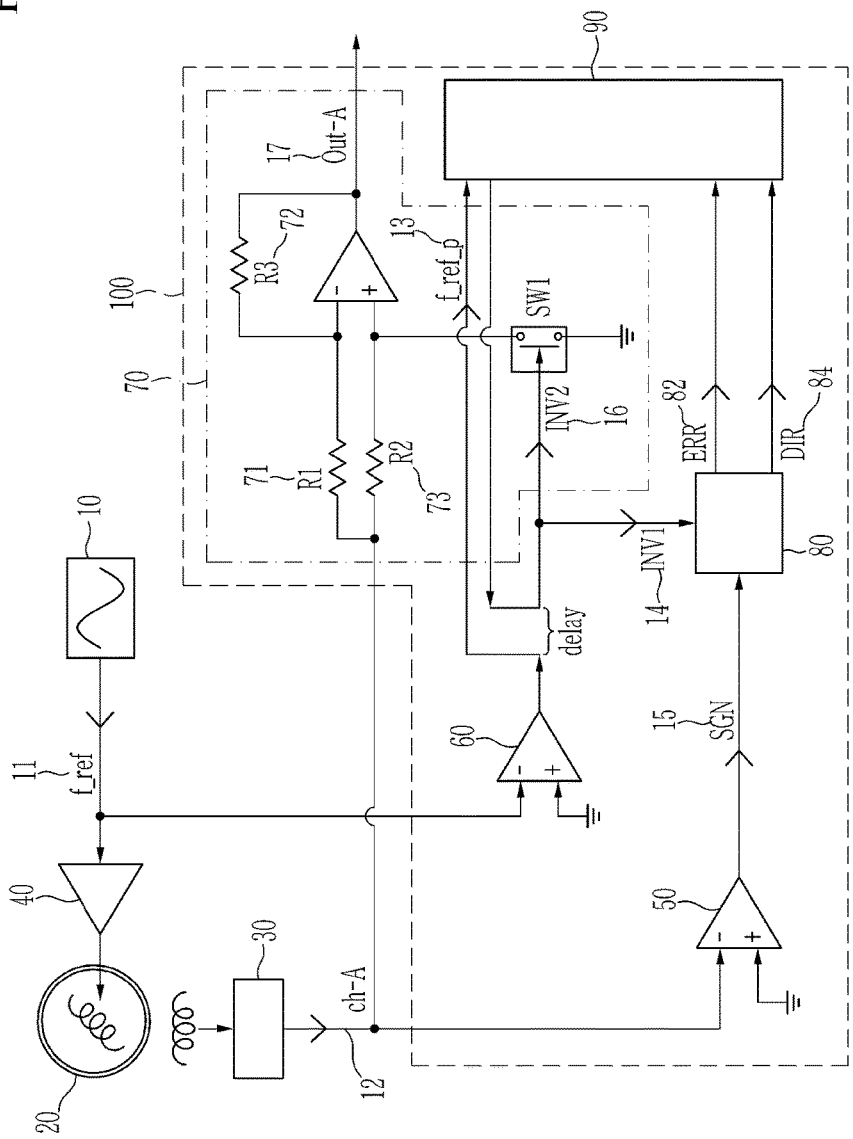
FIG. 3 is a block diagram of a rectification circuit according to embodiments of the present disclosure.

FIG. 3 is a block diagram of a rectification circuit of the resolver output signal according to embodiments of the present disclosure.

As illustrated in FIG. 3, the rectification circuit 100 according to embodiments of the present disclosure includes a first comparator 50, a second comparator 60, a switching amplification circuit 70, a delay amount detection circuit 80, and a microprocessor 90.

The first comparator 50 receives and rectifies the resolver output signal 12, and outputs a reference excitation signal 15.

The second comparator 60 rectifies the excitation signal 11 output from the excitation signal generator 10, and outputs a reference rectification signal 13.

The first comparator 50 and the second comparator 60 may be operational amplifiers, but are not limited thereto.

The switching amplification circuit 70 rectifies the resolver output signal 12 on the basis of a rectification signal 16, and outputs a compensation signal 17.

The delay amount detection circuit 80 compares the reference excitation signal 15 and a delay signal 14 with each other, and outputs a phase difference detection signal 82 and a delay amount excess/shortage signal 84, which are signals for a delay amount of the resolver output signal 12.

The delay amount detection circuit 80 may be implemented by at least one processor operated by a set program. The set program may be programmed to perform each step of a method of outputting the phase difference detection signal 82 and the delay amount excess/shortage signal 84, which are the signals for the delay amount of the resolver output signal 12 according to embodiments of the present disclosure.

The microprocessor 90 receives the reference rectification signal 13, arbitrarily delays the reference rectification signal 13 to output the delay signal 14, calculates the delay amount using the phase difference detection signal 82 output from the delay amount detection circuit 80, and delays the reference rectification signal 13 on the basis of the delay amount to output the rectification signal 16.

The microprocessor 90 may be implemented by at least one processor operated by a set program. The set program may be programmed to perform each step of a method of detecting a delay amount of the resolver output signal 12 according to embodiments of the present disclosure.

The microprocessor 90 may delay the reference rectification signal 13 using an output compare function. The output compare function will be described below.

Here, both of the delay signal 14 and the rectification signal 16 are signals generated by delaying the reference rectification signal 13, but the delay signal 14 is a signal generated by arbitrarily delaying the reference rectification signal 13 by a preset value in order to calculate the delay amount, and the rectification signal 16 is a signal by delaying the reference rectification signal 13 by the delay amount in order to generate the compensation signal 17. In addition, the reference excitation signal 15 is a signal of which a phase and a direction are equal to those of the resolver output signal 12.

Figure 4:
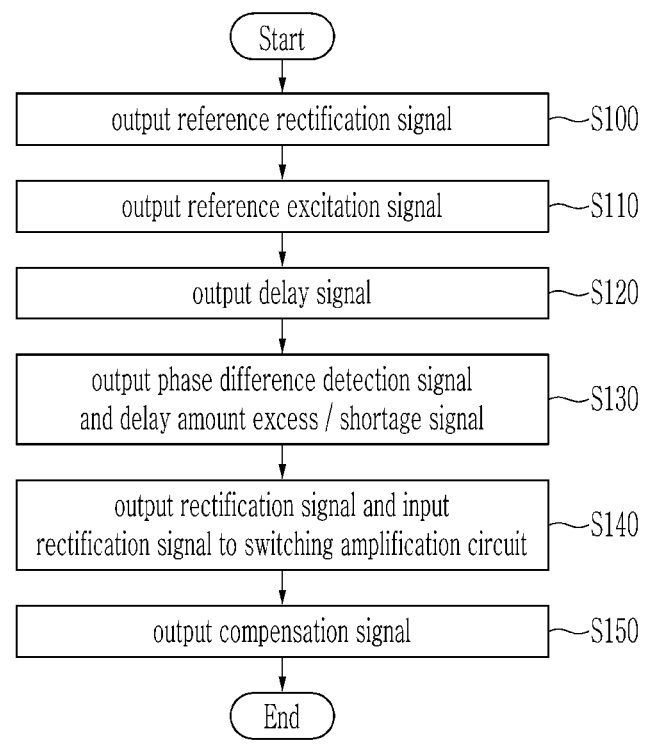
FIG. 4 is a flowchart illustrating a method of rectifying a resolver output signal according to embodiments of the present disclosure.

FIG. 4 is a flowchart illustrating a method of rectifying a resolver output signal according to embodiments of the present disclosure.

As illustrated in FIG. 4, the method of rectifying a resolver output signal according to embodiments of the present disclosure starts while the excitation signal 11 is input to the second comparator 60 and the reference rectification signal 13 is output (S100).

Then, the resolver output signal 12 is input to each of the first comparator 50 and the switching amplification circuit 70. The first comparator 50 rectifies and amplifies the resolver output signal 12, and outputs the reference excitation signal 15 (S110).

Figure 5:
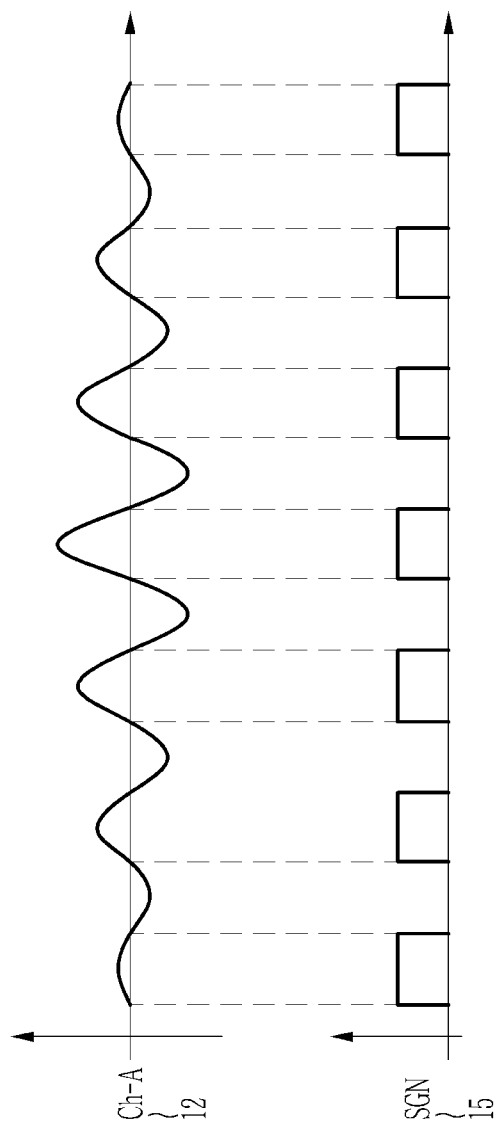
FIG. 5 illustrates signal waveforms illustrating an output principle of a reference excitation signal according to embodiments of the present disclosure.

FIG. 5 illustrates that the reference excitation signal 15 is output. When the resolver output signal 12 having a positive value is input to the first comparator 50, the first comparator 50 outputs 1 as the reference excitation signal 15, and when the resolver output signal 12 having a negative value is input to the first comparator 50, the first comparator 50 outputs 0 as the reference excitation signal 15. The reference excitation signal 15 is input to the delay amount detection circuit 80.

Figure 6:
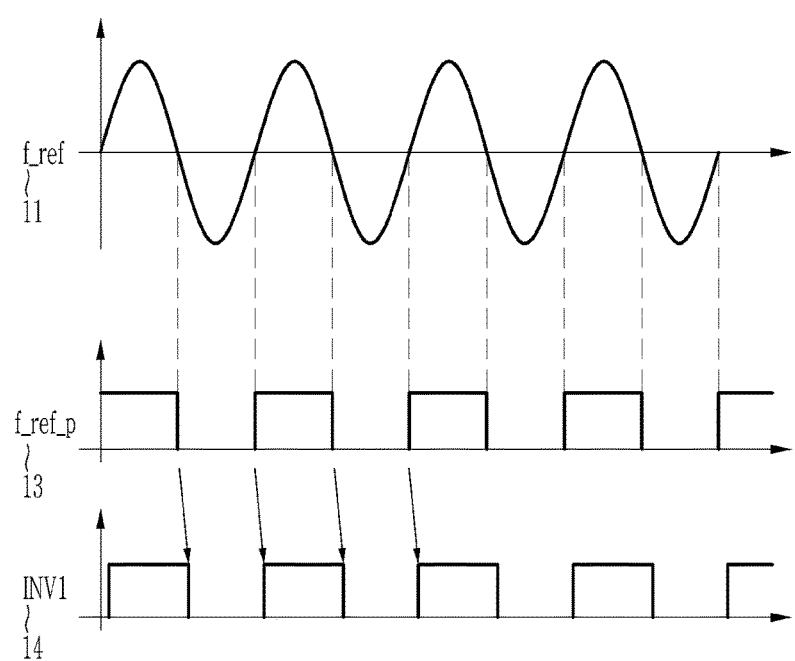
FIG. 6 illustrates signal waveforms illustrating an output principle of a reference rectification signal and a delay signal according to embodiments of the present disclosure.

FIG. 6 illustrates that the reference rectification signal 13 and the delay signal 14 are output. When the excitation signal 11 having a positive value is input to the second comparator 60, the second comparator 60 outputs 1 as the reference rectification signal 13, and when the excitation signal 11 having a negative value is input to the second comparator 60, the second comparator 60 outputs 0 as the reference rectification signal 13. The reference rectification signal 13 is input to the microprocessor 90.

The microprocessor 90 arbitrarily delays the reference rectification signal 13 by a preset value to output the delay signal 14 (S120). The delay signal 14 is input to the delay amount detection circuit 80.

Here, the preset value refers to a value for arbitrarily delaying the reference rectification signal 13 by the microprocessor 90 in order to compare the reference rectification signal 13 with the reference excitation signal 15. In addition, in the case in which the delay signal 14 is output from the microprocessor 90, the output compare function of the microprocessor may be used.

The delay amount detection circuit 80 compares the reference excitation signal 15 and the delay signal 14 with each other, and outputs the phase difference detection signal 82 for a phase difference of the resolver output signal 12 and the delay amount excess/shortage signal 84, which is a delay amount signal for a direction, to input the phase difference detection signal 82 and the delay amount excess/shortage signal 84 to the microprocessor 90 (S130). A process of outputting the phase difference detection signal 82 and the delay amount excess/shortage signal 84 from the delay amount detection circuit 80 will be described with reference to FIGS. 7 and 8.

Figure 7:
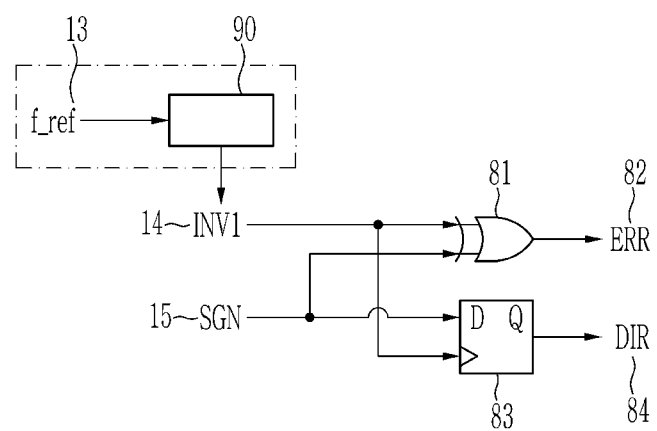
FIG. 7 illustrates an internal configuration of a delay amount detection circuit according to embodiments of the present disclosure.

FIG. 7 illustrates an internal configuration of the delay amount detection circuit, and FIGS. 8A and 8B illustrate the phase difference detection signal and the delay amount excess/shortage signal output from the delay amount detection circuit.

The delay amount detection circuit 80 includes an exclusive-OR gate 81 and a D-type flip-flop 83.

The exclusive-OR gate 81 determines that a case in which phases of two input signals are equal to each other is 'false' to output '0', and determines that a case in which phases of two input signals are different from each other is 'true' to output '1'. That is, when the delay signal 14 and the reference excitation signal 15 are input to the exclusive-OR gate 81, the exclusive-OR gate 81 compares phases of the delay signal 14 and the reference excitation signal 15 with each other, and outputs the phase difference detection signal 82.

The D-type flip-flop 83 compares whether a phase of an input signal leads or lags with respect to a reference clock, and outputs a comparison result. The reference excitation signal 15 is input as an input signal to the D-type flip-flop 83, and the delay signal 14 is input as the reference clock to the D-type flip-flop 83. In this case, the D-type flip-flop 83 outputs a signal detecting whether the delay signal 14 leads or lags with respect to the reference excitation signal 15 as the delay amount excess/shortage signal 84. In the case in which the delay signal 14 leads as compared with the reference excitation signal 15 as illustrated in FIG. 8A, the D-type flip-flop 83 outputs '0' as the delay amount excess/shortage signal 84, and in the case in which the delay signal 14 lags as compared with the reference excitation signal 15 as illustrated in FIG. 8B, the D-type flip-flop 83 outputs '1' as the delay amount excess/shortage signal 84. The phase difference detection signal 82 and the delay amount excess/shortage signal 84 are input to the microprocessor 90, and the delay amount is detected using the output compare function of the microprocessor 90. The phase difference detection signal 82 is input to the microprocessor 90, such that an interrupt is generated. The interrupt is generated only in the case in which a value of the phase difference detection signal 82 is changed. That is, as illustrated in FIGS. 8A and 8B, the phase difference detection signal 82 is changed from '0' to '1' (hereinafter, referred to as a 'rising edge') or is changed from '1' to '0' (hereinafter, referred to as a 'falling edge'). Therefore, the interrupt is generated at the rising edge and the falling edge. In addition, an interrupt value becomes '1' at the rising edge, and becomes '0' at the falling edge. An interrupt generated at the rising edge to have an interrupt value of '1' is called a rising interrupt, and an interrupt generated at the falling edge to have an interrupt value of '0' is called a falling interrupt.

In addition, the rising interrupt and the falling interrupt are repeatedly generated as the interrupt. When the phase difference detection signal 82 is input to the microprocessor 90, such that the rising interrupt is generated, a count is set to 0, and is continuously increased until the falling interrupt is generated. In this case, the count and a delay amount of the delay signal 14 are added to each other to become a delay amount of the resolve output signal 12.

The microprocessor 90 delays the reference rectification signal 13 by the detected delay amount to output the rectification signal 16, and inputs the rectification signal 16 to the switching amplification circuit 70 (S140).

The output compare function of the microprocessor 90 may be used in order to output the rectification signal 16. The output compare function will be described with reference to FIG. 9.

Figure 9:
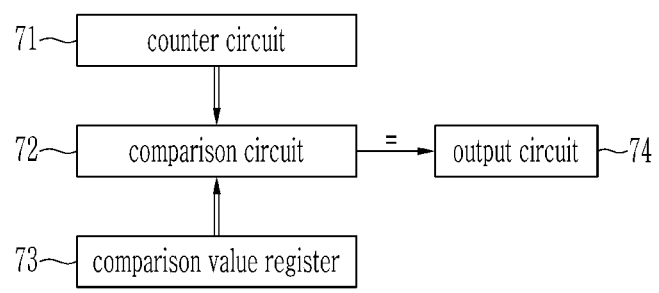
FIG. 9 is a block diagram illustrating an output principle of an output signal using an output compare function of a microprocessor according to embodiments of the present disclosure.

FIG. 9 is a block diagram illustrating a principle of the output compare function of the microprocessor.

The microprocessor 90 implementing the output compare function includes a counter circuit 71, a comparison circuit 72, a comparison value register 73, and an output circuit 74. The counter circuit 71 performs a count by a reference clock, and the comparison circuit 72 detects whether or not the count is equal to a count input to the comparison value register 73. When the count of the counter circuit 71 is equal to the count of the comparison value register 73, a preset output scheduled value is output through the output circuit 74.

In the case of delaying the signal using the output compare function of the microprocessor 90, the microprocessor 90 needs to set the output compare function so that the output compare function is initially operated, and sets an external interrupt or a pin change interrupt (POINT) so that the external interrupt or the POINT is generated at both of the rising edge and the falling edge.

Figure 10:
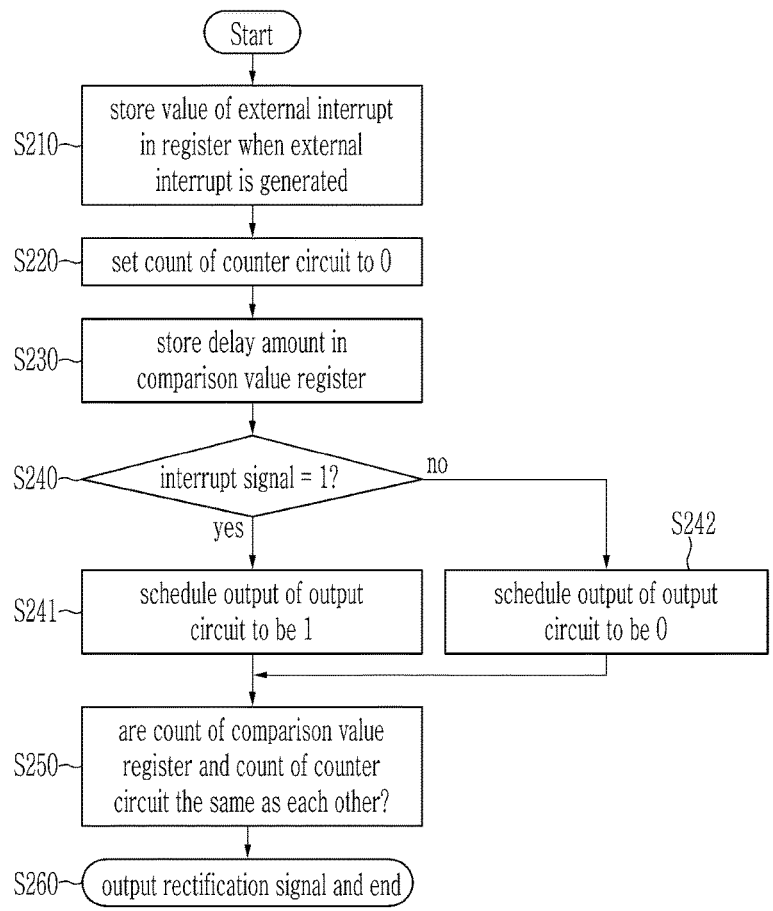
FIG. 10 is a flowchart of a rectification signal output using the output compare function according to embodiments of the present disclosure.
Figure 11:
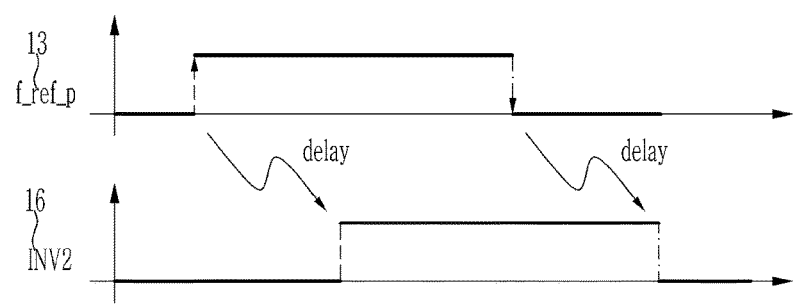
FIG. 11 illustrates an output signal using the output compare function according to embodiments of the present disclosure.

FIGS. 10 and 11 illustrate processes of outputting the rectification signal using the output compare function of the microprocessor.

When the reference rectification signal 13 is input, such that the rising interrupt is generated at the rising edge (a point in which the reference rectification signal 13 is changed from 0 to 1) or the falling interrupt is generated at the falling edge (a point in which the reference rectification signal 13 is changed from 1 to 0), the microprocessor 90 stores a value of the interrupt in a register (S210). The external interrupt or the POINT may be utilized in order to generate the interrupt, but the present disclosure is not limited thereto. In addition, the register refers to any register embedded in the microprocessor 90.

When the rising interrupt (of which an interrupt value is 1) or the falling interrupt (of which an interrupt value is 0) is generated, the count of the counter circuit 71 is initialized to 0, and is then increased (S220). An increase speed of the count of the counter circuit 71 is changed depending on a value of a reference clock. For example, in the case in which the reference clock is set to 1 MHz, the count is increased by 1 per 1 microsecond.

When the count of the counter circuit 71 is initialized, a delay amount is stored in the comparison value register 73 (S230). The delay amount refers to a delay amount detected using the output compare function of the microprocessor 90 described above when the phase difference detection signal 82 is input to the microprocessor 90, such that the rising or falling interrupt is generated. The microprocessor 90 determines whether or not the value of the interrupt stored in the register is 1 (S240). When it is determined in S240 that the value of the interrupt stored in the register is 1, the microprocessor 90 schedules an output scheduled value of the output circuit 74 to be 1 (S241). When it is determined in S240 that the value of the interrupt stored in the register is 0, the microprocessor 90 schedules an output scheduled value of the output circuit 74 to be 0 (S242).

Then, the comparison circuit 72 compares the count increased by the counter circuit 71 and the count stored in the comparison value register 73 with each other. When the count increased by the counter circuit 71 is equal to the count stored in the comparison value register 73 (S250), the output circuit 74 outputs 1 or 0, which is the output scheduled value (S260).

The output scheduled values 1 and 0 are repeatedly output, such that the rectification signal 16 is output. That is, as illustrated in FIG. 11, the microprocessor 90 delays the reference rectification signal 13 on the basis of the delay amount of the resolver output signal 12 to output the rectification signal 16. The microprocessor 90 inputs the rectification signal 16 to the switching amplification circuit 70 (S140).

The switching amplification circuit 70 rectifies the resolver output signal 12 on the basis of the rectification signal 16, and outputs the compensation signal 17 (S150).

Hereinafter, the switching amplification circuit 70 will be described with reference to FIGS. 12 to 14, and a process of outputting the compensation signal 17 will be described with reference to FIGS. 15 and 16.

Hereinafter, in FIGS. 12 to 16, it is considered that the rectification signal 16 has a positive polarity in a section in which the rectification signal 16 has a value of '1' and has a negative polarity in a section in which the rectification signal 16 has a value of '0'.

Figure 12:
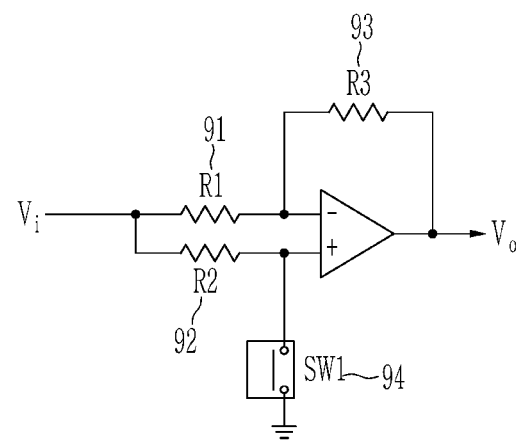
FIG. 12 illustrates a switching amplification circuit according to embodiments of the present disclosure.

FIG. 12 is a circuit diagram illustrating a switching amplification circuit according to embodiments of the present disclosure.

The switching amplification circuit 70 includes three resistors 91, 92, and 93. Resistance values R1, R2, and R3 of the three resistors 91, 92, and 93 are equal to one another. A switch 94 may be opened or closed depending on a polarity of the rectification signal 16. In detail, in the case in which the rectification signal 16 input to the switch 94 of the switching amplification circuit 70 has the negative polarity, the switch 94 is closed to be operated as an inverting amplifier having an amplification degree of −1, and in the case in which the rectification signal 16 input to the switch 94 of the switching amplification circuit 70 has the positive polarity, the switch 94 is opened to be operated as a buffer circuit. In addition, the switch 94 may be an analog switch or a transistor, but is not limited thereto. A microprocessor control unit (MCU) (not illustrated) embedded in the microprocessor 90 may control the switch 94 to be opened and closed.

An operation of the switching amplification circuit 70 depending on an operation state of the switch 94 will be described with reference to FIGS. 13 and 14.

Figure 13:
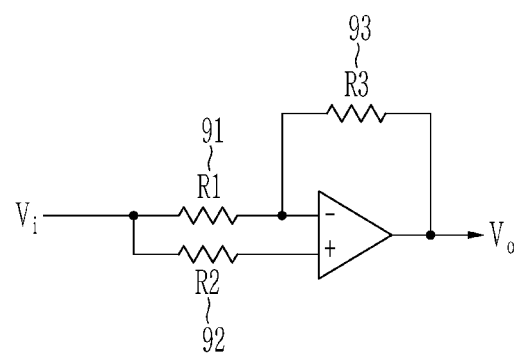
FIG. 13 is a circuit diagram when the switching amplification circuit according to embodiments of the present disclosure is a buffer circuit.

FIG. 13 is a circuit diagram when the switching amplification circuit according to embodiments of the present disclosure is a buffer circuit. When the rectification signal 16 has the positive polarity, the switch 94 of the switching amplification circuit 70 is opened. In this case, the resistance values R1, R2, and R3 of the three resistors 91, 92, and 93 are equal to one another, and the switching amplification circuit 70 is thus operated as the buffer circuit.

Figure 14:
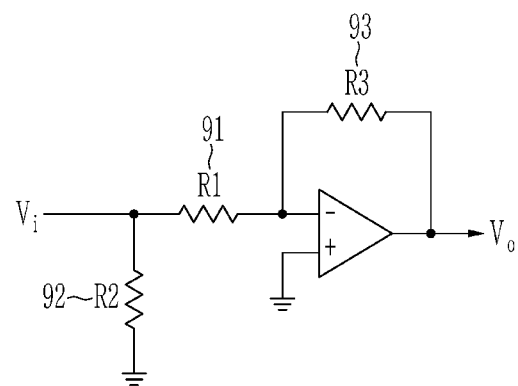
FIG. 14 is a circuit diagram when the switching amplification circuit according to embodiments of the present disclosure is an inverting amplifier having an amplification degree of −1.

FIG. 14 is a circuit diagram when the switching amplification circuit according to embodiments of the present disclosure is an inverting amplifier having an amplification degree of −1. When the rectification signal 16 has the negative polarity, the switch 94 of the switching amplification circuit 70 is closed. In this case, the resistance values R1, R2, and R3 of the three resistors 91, 92, and 93 are equal to one another, and the switching amplification circuit 70 is thus operated as the inverting amplifier having the amplification degree of −1.

An output of the compensation signal depending on an operation state of the switching amplification circuit 70 will be described with reference to FIGS. 15 and 16.

Figure 15:
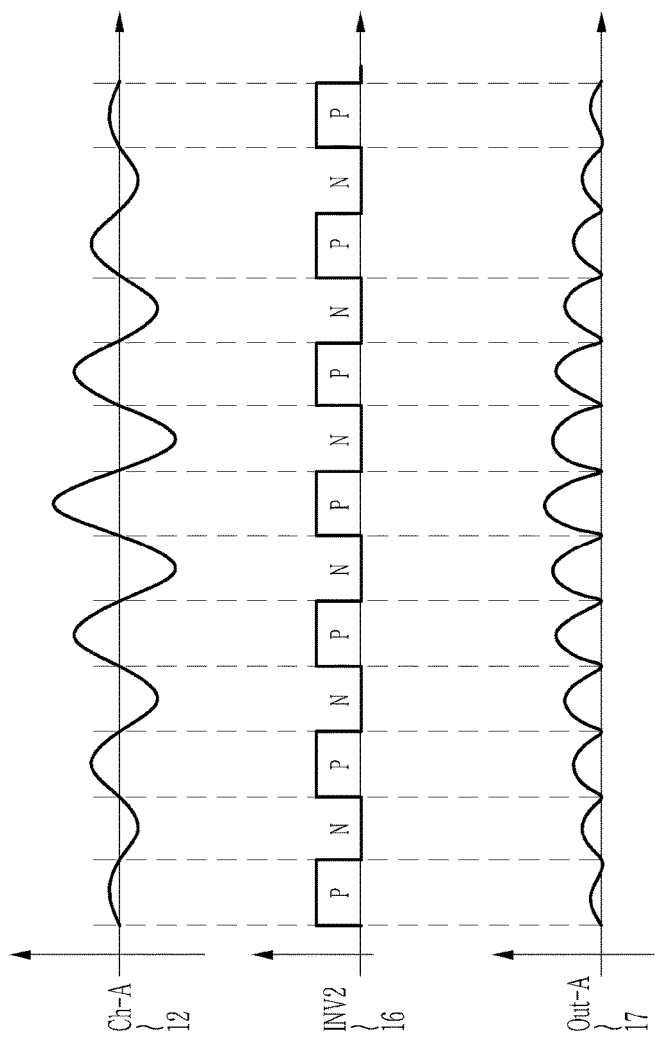
FIG. 15 includes graphs illustrating a compensation signal when the polarity of a resolver output signal is equal to the polarity a rectification signal according to embodiments of the present disclosure.
Figure 16:
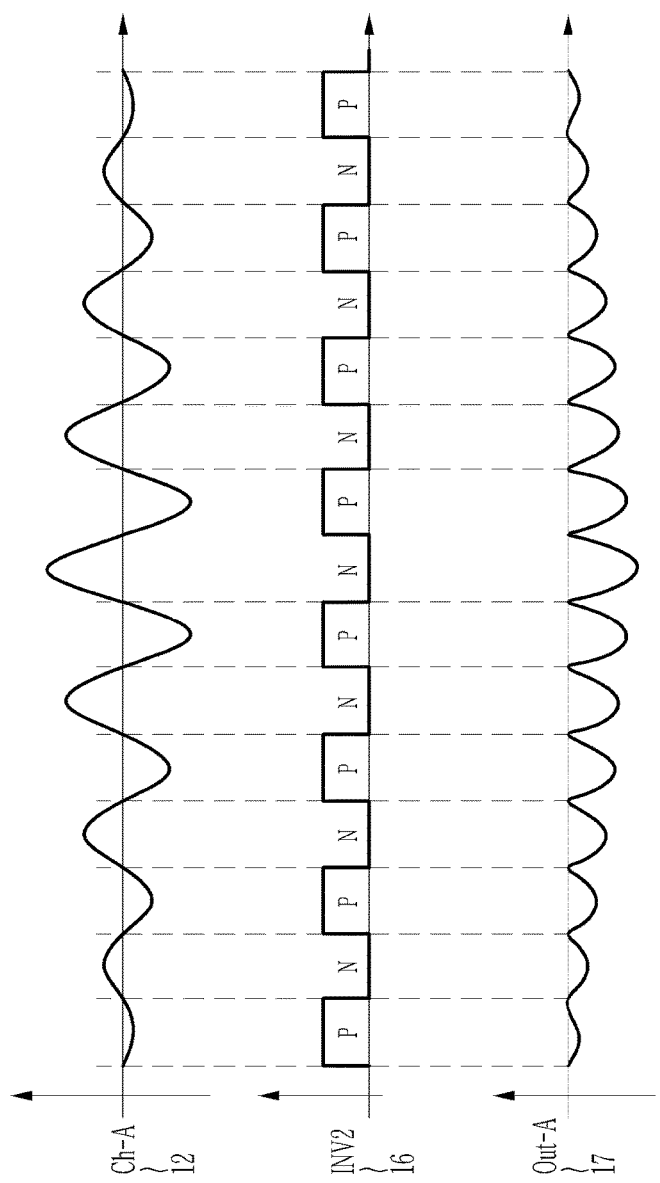
FIG. 16 includes graphs illustrating a compensation signal when the polarity of a resolver output signal is different than the polarity of a rectification signal according to embodiments of the present disclosure.

FIGS. 15 and 16 illustrate that the resolver output signal 12 is rectified on the basis of the rectification signal 16 when the resolver signals 26 and 26' have a positive phase in one period of resolver signals 26 and 26', such that the compensation signal 17 is output. Also in the case in which the resolver signals 26 and 26' have a reverse phase, the resolver output signal 12 is rectified on the basis of the rectification signal 16, such that the compensation signal 17 is output.

FIG. 15 includes graphs illustrating a compensation signal when the polarity of the resolver output signal is equal to the polarity of the rectification signal.

As shown in FIG. 15, when both of the resolver output signal 12 and the rectification signal 16 have a positive polarity, the switching amplification circuit 70 is operated as the buffer circuit, and when both of the resolver output signal 12 and the rectification signal 16 have a negative polarity, the switching amplification circuit 70 is operated as the inverting amplifier having the amplification degree of −1.

Therefore, when the resolver output signal 12 has the positive polarity, the resolver output signal 12 is rectified in a state in which a magnitude and a phase of the resolver output signal 12 are maintained, such that the compensation signal 17 is output, and when the resolver output signal 12 has the negative polarity, the resolver output signal 12 is rectified in a state in which a magnitude of the resolver output signal 12 is maintained and only a phase of the resolver output signal 12 is inverted, such that the compensation signal 17 is output.

In this way, when the polarity of the resolver output signal 12 is equal to the polarity of the rectification signal 16, the resolver output signal 12 is rectified, such that the compensation signal 17 having the positive polarity is output.

FIG. 16 is graphs illustrating a compensation signal when the polarity of the resolver output signal is different than the polarity of the rectification signal.

As shown in FIG. 16, when the resolver output signal 12 has a negative polarity and the rectification signal 16 has a positive polarity, the switching amplification circuit 70 is operated as the buffer circuit, and when the resolver output signal 12 has a positive polarity and the rectification signal 16 has a negative polarity, the switching amplification circuit 70 is operated as the inverting amplifier having the amplification degree of −1.

Therefore, when the resolver output signal 12 has the positive polarity, the resolver output signal 12 is rectified in a state in which a magnitude of the resolver output signal 12 is maintained and a phase of the resolver output signal 12 is inverted, such that the compensation signal 17 is output, and when the resolver output signal 12 has the negative polarity, the resolver output signal 12 is rectified in a state in which a magnitude and a phase of the resolver output signal 12 are maintained, such that the compensation signal 17 is output.

In this way, when the polarities of the resolver output signal 12 and the rectification signal 16 are opposite to each other, the resolver output signal 12 is rectified, such that the compensation signal 17 having the negative polarity is output.

In addition, the compensation signals 17 are output from two circuits connected to each other in parallel, respectively. The output compensation signals 17 are sampled to obtain a sine wave and a cosine wave, and the sine wave and the cosine wave are input, respectively, to two input terminals of an angle tracking observer (ATO) (not illustrated).

Then, a position angle of the rotor of the motor may be detected using the ATO, and the delay amount of the resolver output signal 12 may be compensated for.

A method of sampling the compensation signal 17 or detecting the position angle of the rotor of the motor using the ATO and a method of compensating for the delay amount of the resolver output signal 12 are apparent to a person of an ordinary skill in the art, and a description therefor is thus omitted herein.

Figure 17:
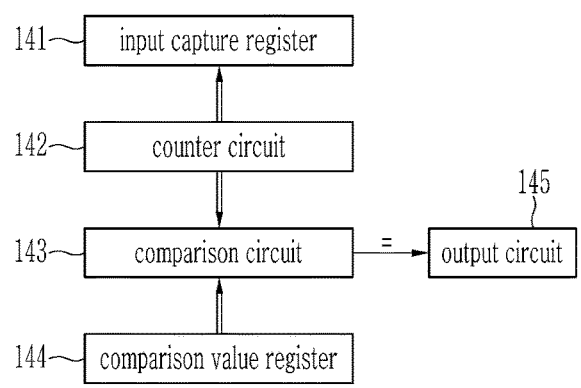
FIG. 17 is a block diagram illustrating an output principle of an output signal using an input capture function of a microprocessor according to embodiments of the present disclosure.

In another example, the delay amount of the resolver output signal 12 may be detected using an input capture function of the microprocessor 90. FIG. 17 is a block diagram illustrating an output principle of an output signal using an input capture function of a microprocessor according to embodiments of the present disclosure.

The input capture function of the microprocessor is similar to the output compare function described above, but is different from the output compare function of initializing the count of the counter circuit to 0 and calculating the delay amount when the interrupt is generated due to the input of the phase difference detection signal 82 to the microprocessor 90 in that the delay amount of the resolver output signal 12 is calculated without initializing the count of the counter circuit to 0 when the interrupt is generated.

The microprocessor 90 implementing the input capture function includes an input capture register 141 a counter circuit 142, a comparison circuit 143, a comparison value register 144, and an output circuit 145.

Similar to a case of using the output compare function of the microprocessor 90, a count of the counter circuit 142 is set to 0, the counter circuit 142 starts a count by a reference clock, the comparison circuit 143 detects whether or not the count is equal to a count input to the comparison value register 144, and a preset output scheduled value is output as an output signal through the output circuit 145 when the count is equal to the count input to the comparison value register 144. The count input to the comparison value register 144 corresponds to a delay amount of the resolver output signal 12.

A method of detecting the delay amount of the resolver output signal 12 using the input capture function of the microprocessor 90 will be described.

When the rising interrupt is generated by the phase difference detection signal 82, a rising count, which is a count at a point in time in which the rising interrupt is generated, is stored in the input capture register.

Then, when the falling interrupt is generated by the phase difference detection signal 82, a falling count, which is a count at a point in time in which the falling interrupt is generated, is stored in the input capture register 141.

The microprocessor 90 calculates a difference between the falling count and the rising count to detect the delay amount of the resolver output signal 12. The microprocessor 90 outputs the rectification signal 16 on the basis of the detected delay amount to input the rectification signal 16 to the switching amplification circuit 70. The switching amplification circuit 70 rectifies the resolver output signal 12 on the basis of the rectification signal 16, and outputs the compensation signal 17. The compensation signals 17 are output from circuits connected to each other in parallel, respectively, and the position angle of the rotor of the motor may be detected and the delay amount of the resolver output signal 12 may be compensated for, using the ATO on the basis of the respectively output compensation signals 17.

While this disclosure has been described in connection with certain embodiments, it is to be understood that the disclosure is not limited to the disclosed embodiments, but, on the contrary, is intended to cover various modifications and equivalent arrangements included within the spirit and scope of the appended claims.

What is claimed is:

1. An apparatus for rectifying a resolver output signal, comprising:
a resolver configured to receive an excitation signal and to output a resolver output signal based on the excitation signal, the excitation signal indicating a position of a rotor of a motor;
a microprocessor configured to receive a reference rectification signal generated by rectification of the excitation signal and to output a delay signal by delaying the reference rectification signal according to a preset value; and
a delay amount detection circuit configured to receive a reference excitation signal generated by rectification of the resolver output signal, to receive the delay signal from the microprocessor, to compare the reference excitation signal with the delay signal, and to output a phase difference detection signal and a delay amount excess/shortage signal to the microprocessor,
wherein the microprocessor includes a switching amplification circuit configured to detect a delay amount of the resolver output signal based on the phase difference detection signal, to output a rectification signal based on the delay amount, to receive the rectification signal, to rectify the resolver output signal by performing a switching operation based on the rectification signal, and to output a compensation signal.

2. The apparatus of claim 1, wherein:
the delay amount detection circuit includes:
an exclusive-OR gate configured to receive the delay signal and the reference excitation signal and to output the phase difference detection signal which indicates a phase difference between the delay signal and the reference excitation signal; and
a D-type flip-flop configured to receive the reference excitation signal as an input signal, to receive the delay signal as a reference clock, and to output the delay amount excess/shortage signal indicating whether the delay signal leads or lags with respect to the reference excitation signal.

3. The apparatus of claim 1, wherein:
the microprocessor is configured to detect the delay amount using a output compare function.

4. The apparatus of claim 1, wherein:
the microprocessor is configured to detect the delay amount using an input capture function.

5. The apparatus of claim 1, wherein:
the microprocessor includes:
a counter circuit configured to initialize a count when the reference rectification signal is input, such that an interrupt is generated, by increasing the count from an initial value;
a comparison value register configured to store the delay amount;
a comparison circuit configured to detect whether the delay amount is equal to the count; and
an output circuit configured to output a preset output scheduled value when it is detected that the delay amount is equal to the count.

6. The apparatus of claim 1, wherein:
when a polarity of the rectification signal is equal to a polarity of the resolver output signal, the switching amplification circuit operates as a buffer circuit when the resolver output signal has a positive polarity and operates as an inverting amplifier when the resolver output signal has a negative polarity.

7. The apparatus of claim 1, wherein:
when a polarity of the rectification signal is opposite of a polarity of the resolver output signal, the switching amplification circuit operates as an inverting amplifier when the resolver output signal has a positive polarity and operates as a buffer circuit when the resolver output signal has a negative polarity.

8. A method for rectifying a resolver output signal output by a resolver, the method, comprising:
outputting, by a microprocessor, a delay signal by delaying an excitation signal output by an excitation signal generator by a preset value;
comparing, by a delay amount detection circuit, the delay signal with a reference excitation signal generated by rectification of the excitation signal;
outputting, by the delay amount detection circuit, a phase difference detection signal and a delay amount excess/shortage signal to the microprocessor;
detecting, by the microprocessor, a delay amount of the resolver output signal based on the phase difference detection signal;
outputting, by the microprocessor, a rectification signal generated by delaying a reference rectification signal by the delay amount;
receiving, by a switching amplification circuit, the rectification signal; and outputting, by the switching amplification circuit, a compensation signal generated by rectification of the resolver output signal by a switching operation based on the rectification signal.

9. The method of claim 8, wherein:

the delay amount detection circuit includes an exclusive-OR gate and a D-type flip-flop, and the outputting of the phase difference detection signal and the delay amount excess/shortage signal comprises:
- receiving, by the exclusive-OR gate, the delay signal and the reference excitation signal;
- outputting, by the exclusive-OR gate, the phase difference detection signal which indicates a phase difference between the delay signal and the reference excitation signal;
- receiving, by the D-type flip-flop, the reference excitation signal as an input signal;
- receiving, by the D-type flip-flop, the delay signal as a reference clock; and
- outputting, by the D-type flip-flop, the delay amount excess/shortage signal indicating whether the delay signal leads or lags with respect to the reference excitation signal.

10. The method of claim 8, further comprising:

detecting, by the microprocessor, the delay amount using an output compare function.

11. The method of claim 8, further comprising:

detecting, by the microprocessor, the delay amount using an input capture function.

12. The method of claim 8, further comprising:

initializing, by the microprocessor, a count when the reference rectification signal is input, such that an interrupt is generated, by increasing the count from an initial value;

storing, by the microprocessor, the delay amount in a comparison value register;

detecting, by the microprocessor, whether the delay amount is equal to the count; and outputting, by the microprocessor, output a preset output scheduled value when it is detected that the delay amount is equal to the count.

13. The method of claim 8, wherein:

when a polarity of the rectification signal is equal to a polarity of the resolver output signal, the switching amplification circuit operates as a buffer circuit when the resolver output signal has a positive polarity and operates as an inverting amplifier when the resolver output signal has a negative polarity.

14. The method of claim 8, wherein:

when a polarity of the rectification signal is opposite of a polarity of the resolver output signal, the switching amplification circuit operates as an inverting amplifier when the resolver output signal has a positive polarity and operates as a buffer circuit when the resolver output signal has a negative polarity.

* * * * *